April 3, 1962 R. H. STURDY 3,027,627

ENCAPSULATED MINIATURE ELECTRICAL CIRCUITS

Filed May 28, 1959 2 Sheets-Sheet 1

INVENTOR.
ROBERT H. STURDY
BY
Dike, Thompson & Bronstein
ATTORNEYS

ENCAPSULATED MINIATURE ELECTRICAL CIRCUITS

Filed May 28, 1959 2 Sheets-Sheet 2

INVENTOR.
ROBERT H. STURDY
BY
Dike, Thompson & Bronstein
ATTORNEYS

United States Patent Office 3,027,627

Patented Apr. 3, 1962

3,027,627

ENCAPSULATED MINIATURE ELECTRICAL CIRCUITS

Robert H. Sturdy, Brookline, Mass., assignor to C K Components, Inc., Watertown, Mass., a corporation of Massachusetts Filed May 28, 1959, Ser. No. 816,441
4 Claims. (Cl. 29—155.5)

The present invention relates to improvements in encapsulated electrical circuits and, in one particular aspect, to the novel and improved assembly of a multiplicity of electrical components into miniaturized and highly compacted molded circuits of low-cost manufacture.

In the fabrication of electrical circuit assemblies, particularly those which are to be exposed to severe environmental conditions, known practices have involved the exploitation of certain molding and modular construction techniques. These practices have recognized that plastic encapsulation of components can increase protection against injuries of thermal, electrical and mechanical origins, and that use of pre-assembled "building block" circuits can facilitate construction and repair of complex electrical systems. For example, it has been known that a number of circuit elements may be wired together upon a small chassis and then molded or potted within a solid block of resin with contact pins projecting outwardly to permit the completed unit to be inserted into and withdrawn from a system by way of an accommodating socket. Where bulk and the labors of intricate wiring are not at a premium, these units can be of distinct value. However, in attempts at significant miniaturization, one inevitably encounters what appear to be irreducible minimums of total volume and weight, dictated largely by the need for spacing the components sufficiently to permit wiring and soldering of their interconnections. Moreover, the components must be supported during and after their wiring into the circuitry which is to be encapsulated, and this has required some form of chassis or base which itself adds to the volume and weight of the unit. Through practice of the present teachings, these and other difficulties are avoided, and a large number of components may be readily assembled into electrically interconnected circuit relationships and encapsulated in minute sizes with precise orientations.

Accordingly, it is one of the objects of this invention to provide novel and improved encapsulated circuits of highly miniaturized bulk in which a multiplicity of parallel electrical components and their interconnecting joints and leads and potting compound constitute the sole elements.

It is a further object to provide a method for producing encapsulated electrical circuits wherein successive molding operations facilitate rapid assembly of a multitude of components into miniature units having uniform characteristics.

By way of a summary account of a practice of the invention in one of its aspects, I provide for the closely-spaced parallel alignment of a plurality of small elongated electrical circuit components, such as resistors, semiconductor devices, and capacitors, and a number of straight conductors, in a mold which is then filled with an insulating casting resin enveloping not only the bodies of these components but short lengths of their projecting leads as well. Upon solidification of the resin and removal of the united conductors and components from the mold, certain of the conductors and the component leads projecting from opposite ends of the hardened resin block are bent into predetermined connecting relationship with others thereof, close to their block ends. Excess lengths of each of the bent leads and conductors are removed by cutting, and each end of the hardened block is then dipped into molten solder to join all of the connections at that end solidly in a single operation. The block with circuit interconnections formed at each end is then positioned within another mold into which the same resin is introduced and solidified to produce a protective layer at each end covering the circuit interconnections appearing there but permitting certain of the connections and leads to project outwardly therefrom and serve as connecting pins.

Although the features of this invention which are believed to be novel are set forth in the appended claims, additional details and further objects and advantages may be most readily perceived through reference to the following description taken in connection with the accompanying drawings, wherein:

FIGURE 1 is a pictorial view of one form of completed miniature encapsulated circuit assembly;

FIGURE 2 provides schematic, block, and pictorial diagrams of interconnected circuits which are encapsulated in the unitary miniature assembly of FIGURE 1;

FIGURE 3 pictures certain of the circuit components of FIGURE 2, and a number of conductors, arranged in a closely-packed parallel alignment and associated with a dashed-line outline of a block into which they are to be molded to preserve the illustrated relationships;

Figure 1:
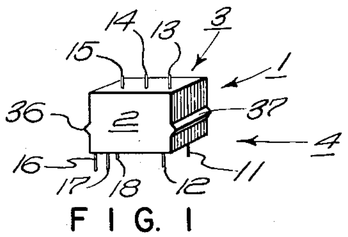
Figure 2:
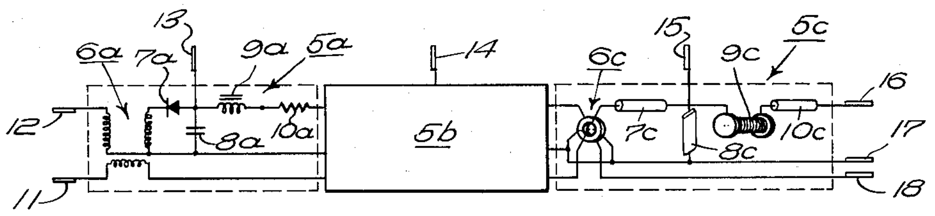

An encapsulated circuit module 1 of the miniature form illustrated in FIGURE 1 is representative of those which may be produced in accordance with these teachings. External dimensions of the full-size block of cast insulating resin 2 are merely about 5/8 x 7/16 x 5/16 inch, although one typical circuit embedded wholly within it actually includes fifteen separate electrical circuit components and about twenty separate connection sites in addition to those of the sets of visible terminal pins 3 and 4. The typical circuit components and their interconnections appear in FIGURE 2 in a three-stage magnetic shift register circuit suitable for use in certain computer networks. Each of the three stages 5*a*, 5*b*, and 5*c* is identical to its companions, and the corresponding components thereof are designated by the same reference characters on the drawings, though with corresponding distinguishing subscripts *a*, *b* and *c*. Referring to the full-size pictorialized components in third stage 5*c*, it is found that the interconnected miniature toroidal core and winding unit 6*c*, semiconductor diode 7*c*, capacitor 8*c*, iron-cored choke 9*c*, and resistor 10*c*, tend to occupy a substantial space and are also in a complex array requiring a number of electrical connections. These space and connection difficulties are greatly magnified when it is sought to package three such stages, in interconnected relationship, and with terminal pins 11–18, in a fully protected encapsulated unit of miniature proportions such as those of the FIGURE 1 module.

Figures 3, 4, 5:
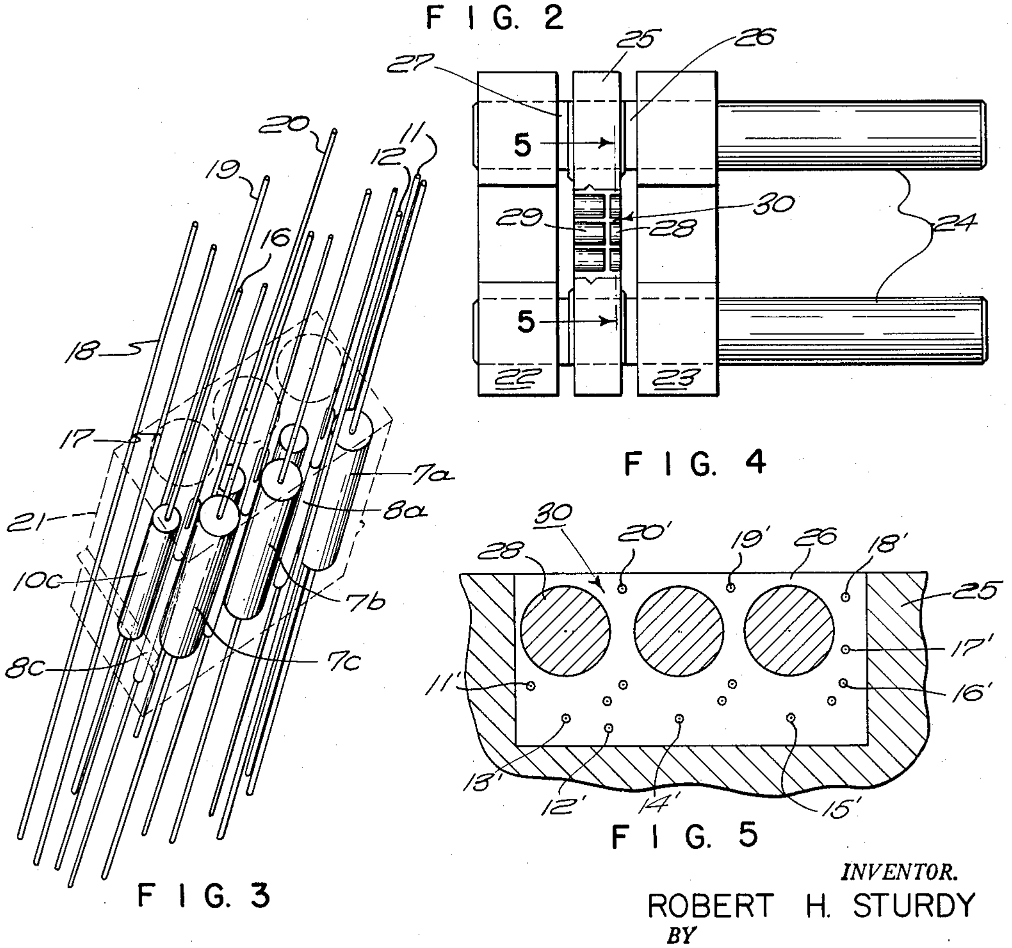
FIGURE 4 is a plan view of a mold suitable for initial casting of components into a unitary sub-assembly in preparation for further wiring and encapsulation operations.
FIGURE 5 represents an enlarged transverse cross-section of part of the mold of FIGURE 4, taken along the section line 5—5.

In the FIGURE 3 enlargement, all of the non-inductive components are shown to be arranged in closely-packed parallel relationship with minute spacings between them, nevertheless. Each of these components is in a thin elongated form which has become a standard in the industry, the connecting pigtail leads thereof extending outwardly in opposite directions and in parallel alignment. As is discussed in greater detail later herein, the initial arrangement of such components into this parallel array not only minimizes their packaged volume but also materially facilitates electrical wiring. For wiring purposes, and to avoid the complications of using special terminal pins, a number of straight and relatively stiff feed-through wires, 11, 12, and 17–20, are also preferably aligned in a predetermined spaced parallel relationship with the components. The mounting and soldering of each minute component and wire into the module in the illustrated relationship using conventional techniques would obviously be laborious, costly and enormously exacting, even with the aid of special jigs and fixtures. The need for such jigs and fixtures is entirely obviated, however, by a first encapsulation which bonds the wires and components together in precise relationship within a block of insulating resin. Dashed-line outline 21 in FIGURE 3 is that of a suitable cast block of resin which initially unites these elements into a sub-assembly, whereby the sub-assembly may thereafter be readily manipulated to serve as its own jig in further assembly and electrical connection steps.

One construction of a potting mold which may be used in the precision casting of the sub-assembly is shown in a plan view in FIGURE 4 and in a partial transverse cross-sectional view in FIGURE 5. The mold is advantageously of a clamp type which includes U-shaped fixed and movable ends, 22 and 23, respectively, the latter being slidable along the guide rods 24. Intermediate these ends there are disposed a central U-shaped mold cavity body 25 and front and back mold blanks 26 and 27. The two mold blanks 26 and 27 are provided with precisely-aligned patterns of small drilled holes which accommodate the component pigtail leads and feed-through wires, these holes having been identified in FIGURE 5 by the same reference characters as appear on the corresponding components and leads in FIGURE 3, with distinguishing single-prime accents being added. Each mold blank also includes a set of three inwardly-projecting cylindrical plugs, 28 and 29 for the blanks 26 and 27, respectively, which function to develop corresponding cylindrical recesses in the resin casting. These recesses accommodate other circuit components, such as the magnetic circuit elements 6*a–c* and chokes 9*a–c*, which are added to the sub-assembly after the initial casting operation. The molding cavity, 30, is open at the top to receive the resin, which may be a filled or unfilled epoxy, polyester or other resin commonly used in encapsulation of electrical apparatus. In preparation for the first potting, the feed-through wires and component pigtails are simply threaded into the accommodating holes in the front and back blanks, and the blanks are then clamped together about the cavity body. The cavity body, 25, is of a width greater than the lengths of the components being potted, whereby the resin poured into cavity 30 will surround the component pigtail leads for at least a short distance from each end of each component.

Figure 6:
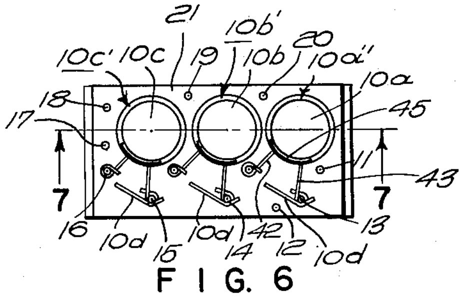
FIGURE 6 is a view of one end of a molded sub-assembly, with circuit interconnections established.

Upon solidification of the resin, the mold is parted and the block of resin and molded elements are removed as a unit having the relationships shown in FIGURE 3. Inasmuch as the lead wires are set directly into the plastic at the positions where they emerge from the opposite ends of the cast block 21, they may then be bent sharply across the block to make connection with other lead wires without danger of injuring their junctions with the associated components. For example, the FIGURE 6 end view, which corresponds to the top of the sub-assembly in FIGURE 3, illustrates that the connections of the three capacitor leads 10*d* with the feed-through leads 13–15 are made by bending leads 10*d* in the direction of the respective feed-through leads and at least partially wrapping them around these feed-through leads as close as possible to the surface of the resin block. Excess lengths of the capacitor leads only are then removed by cutting. Pairs of leads of extremely fine wires, from iron-cored chokes 10*a*–10*c*, are likewise wrapped about certain of the other leads near the surface of the block 21. Chokes 10*a*–10*c* are pre-wound components which are added to the sub-assembly by insertion into the accommodating cylindrical recesses 10*a'*–10*c'* which were formed by the three mold plugs 29, shown in FIGURE 4. It is important not only that these chokes be rigidly united with the casting 21 but that they also be protected against attack by molten solder and fluxes used in dip soldering operations, and for these reasons a small amount of liquid resin is deposited in each of the recesses 10*a'*–10*c'* to fill the spaces which would otherwise result when the miniature chokes are dropped into place. Preferably, this resin, 31, also covers the outer ends of the chokes, as is depicted in the transverse cross-section in FIGURE 7. The resin may be the same as that of which block 21 is cast, and is at least compatible with it.

Figures 8, 9:
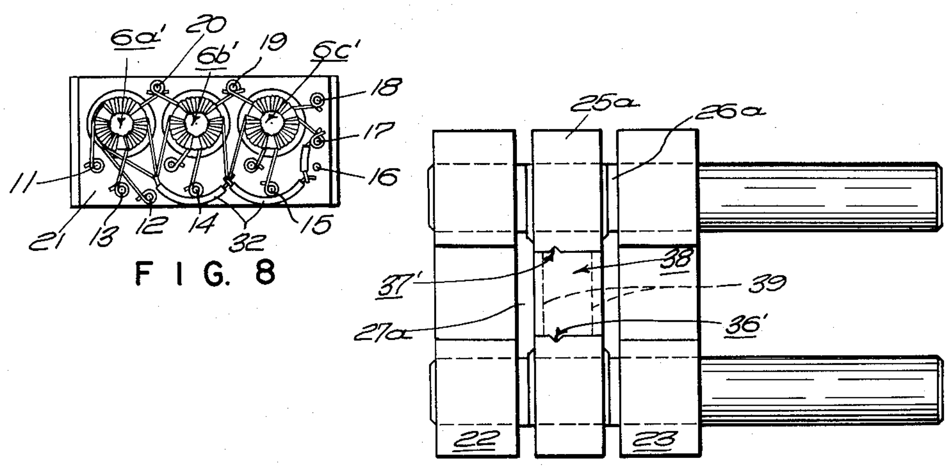
FIGURE 8 is a view of another end of the sub-assembly of FIGURES 4, 6 and 7.
FIGURE 9 depicts a mold arranged for encapsulation of end connections of a sub-assembly.

Similar wiring and mounting techniques are practised at the opposite end of the sub-assembly. The end view in FIGURE 8 displays the circuit interconnections formed by bending and wrapping of leads close to the end surface of block 21. In this instance, sleeves of insulation, 32, are positioned upon some of the leads to prevent inadvertent soldering to leads near which they cross in making the desired connections. Toroidal core and coil units 6*a*–6*c* are covered and bonded into position by resin, 33, in the recesses 6*a'*–6*c'* left by mold plugs 28.

Figure 7:
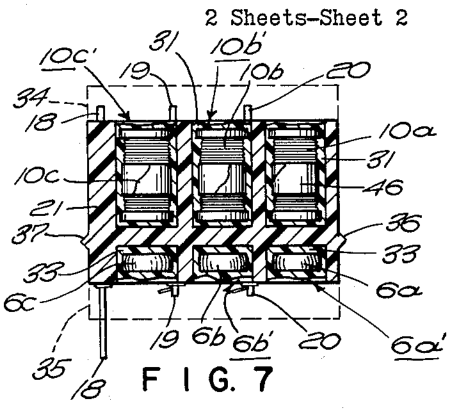
FIGURE 7 is a cross-section of the molded sub-assembly taken along section line 7—7 in FIGURE 6.

When the inductive components have been mounted and bonded and the desired temporary end connections have been made in the aforementioned bending and wrapping procedures, the leads which are not to serve as terminal pins are clipped back to nearer the end surfaces of block 21. As is shown in FIGURE 7, for example, both exposed ends of leads 19 and 20 have been so cut, although the top end only of lead 18 has been cut and the bottom remains long enough to function as a terminal pin after final encapsulation has been performed. The temporary circuit junctions made by wrapping or mere contacting of the leads are of course left undisturbed in the cutting back of the leads, and these temporary junctions are then bonded together in electrically and mechanically secure relationship. A particularly simple bonding technique which may be used involves dipping each end of the assembly into molten solder momentarily. Upon withdrawal of each end from the solder each junction quickly solidifies. The encapsulating resins 21, 31 and 33 protect each of the embedded components and are not materially affected by their brief immersions into solders and soldering fluxes, or by brief heating in the course of welding of the connections.

Protection and insulation of the soldered connections are next provided by molding thin end caps over the areas designated by dashed linework 34 and 35 in FIGURE 7.

These end caps are preferably of the same casting resin employed in the fabrication of the initial casting 21, such that they are compatible and tend to become integral with block 21. While the clipped wiring is below the surface of these caps, those wires which are to serve as terminal pins project outwardly from them. The casting of these ends may be performed using the clamp mold shown in FIGURE 9, which is generally the same as that of FIGURE 4 except that the central cavity body 25*a* is wider than body 25, and the front and back mold blanks 26*a* and 27*a* do not have molding plugs and possess only such small aligned drilled holes as are needed to accommodate the few leads remaining uncut to serve as terminal pins. Locating ridges 36 and 37 which were formed along two sides of the cast sub-assembly are mated with the corresponding slots 36′ and 37′ in the cavity body 25*a* to position the cast block 21 centrally of the mold cavity 38. As is indicated by dashed lines 39, the block of resin which was cast in the first encapsulation step is sufficiently shorter than the cavity 38 to permit resin to be deposited in the end spaces and solidified to form the integral caps 34 and 35. The encapsulated unit withdrawn from the mold of FIGURE 9 requires only trimming of its projecting leads to the desired terminal length to complete the assembly.

Figure 10:
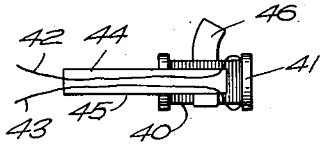
FIGURE 10 illustrates a miniature iron-cored choke having a tape atachment which facilitates handling and wiring procedures.

Delicacy and extraordinary fineness of the wiring from the inductive components 6*a*–6*c* and 10*a*–10*c* prevents their being initially cast into the sub-assembly in the manner of the other components. Their fine leads are of insufficient stiffness to support the components during such casting, and, particularly in the case of the heavier iron-cored chokes 10*a*–10*c*, the lead wires have a tendency to tangle and break even as the chokes are supported by them while being carefully lowered into the special recesses 10*a*′–10*c*′. In preventing such breakage, each choke is provided with tape wrappings serving the dual purposes of a miniature handle and wire spacer. By way of example, after the choke 10*a* in FIGURE 10 is constructed by winding fine insulated wire 40 about the relatively heavy magnetizable core 41, the two thin and delicate leads 42 and 43 are then pressed gently into the adhesive surface 44 of a thin tape strip 45, in spaced relationship, and a second tape strip 46 is then wrapped transversely about the center of the choke to hold the wires and strip 45 in place. Tape strip 45 may then be gripped to manipulate the choke into position, without danger of breakage or tangling of the fine wiring. Once the choke has been deposited in and fixed within the cooperating recess, the wires 42 and 43 are pulled away from the tacky adhesive of the strip 45 and bent and wrapped into the desired connections with other leads. The excess lengths of tape which project outwardly beyond the recesses are cut away after the fine wires have been separated from them and before the final encapsulation.

The precision with which modules can be fabricated in this manner promotes electrical as well as mechanical uniformity between molded units. Stray electrical effects such as those of capacitance and inductance tend to be fixed because the dimensions and relative orientations of parts are all minute and cannot vary significantly from unit to unit.

The specific disclosures presented herein are intended to be of a descriptive rather than a limiting nature, and it should be understood that various changes, substitutions, combinations, or modifications may be introduced in practice of these teachings without departing either in spirit or scope from this invention in its broader aspects.

What I claim as new and desire to secure by Letters Patent of the United States is:

1. The method of manufacturing miniature encapsulated electrical circuitry which comprises the steps of supporting the leads of a plurality of electrical circuit components to align said components in closed-spaced substantially parallel relationship, molding insulating resin directly about said aligned components to form a subassembly comprising a solid block of resin having said components molded therein and having said parallel leads extending from opposite ends of said block, connecting predetermined ones of said leads at each end of said block with other of said leads adjacent the same end of said block to form circuit connections between said components, bonding the connections of said leads electrically and mechanically, and then molding a layer of insulating resin across each of said ends of said block and fully over the positions of said connections to embed the leads and connections while permitting at least certain of said leads to project outwardly from said resin to serve as terminals.

2. The method of manufacturing miniature encapsulated electrical circuitry which comprises the steps of supporting a plurality of straight conductors and the oppositely-extending pigtail leads of elongated electric circuit components at spaced positions to align said conductors and components in closely-spaced substantially parallel relationship, molding insulating resin directly about said aligned components and conductors between said spaced positions to form a rigid sub-assembly including a block of said resin having said components and conductors molded therein and having only parts of said leads and conductors extending from opposite ends thereof, bending predetermined ones of said leads and conductors at each end of said block into connection with other of said leads and conductors close to the same end of said resin block to form electric circuit connections between said components while leaving at least some of said leads and conductors upright, cutting close to said ends of said resin block certain of said leads and conductors which are to be insulated, dip-soldering all of the connecting leads and conductors at each end of said sub-assembly simultaneously, and then molding insulating resin over said opposite ends of said sub-assembly to embed the soldered and cut connections therein while permitting at least some of said leads and conductors to project outwardly from said resin to serve as terminals.

3. The method of manufacturing miniature encapsulated electrical circuitry which comprises the steps of supporting a plurality of straight conductors and the oppositely-extending pigtail leads of elongated electric circuit components at opposite ends of a mold to align said conductors and components in closely-spaced substantially parallel relationship within the mold, said mold having at least one plug extending therein from at least one of said opposite ends, casting insulating resin directly about said components and conductor and plug in the mold to form a rigid sub-assembly including a block of said resin having said components and conductors molded therein with parts of said conductors and leads extending from opposite ends thereof and with at least one recess near an end thereof left by said plug, inserting an electric circuit component into the recess together with a quantity of insulating bonding material while keeping lead wires thereof accessible outside of the recess, bending predetermined ones of said leads and conductors and lead wires at each end of said block into connection with others thereof close to the same end of said resin block to form electric circuit connections between said components, dip-soldering all of the connecting leads and conductors and lead wires at each end of said sub-assembly simultaneously, and then molding insulating resin over said opposite ends of the sub-assembly to embed the soldered connections therein while permitting at least some of said leads and conductors to project outwardly from said resin to serve as terminals.

4. The method as set forth in claim 3 wherein the electric circuit component inserted into the recess has fine lead wires which tend to break and tangle under weight thereof and further comprising the steps of pressing said fine lead wires into the tacky surface of a strip of adhesive tape, securing one end of the tape to the component, inserting said circuit component into the recess while holding it by the tape, pulling the tape away from the fine wires which lie outside the recess, and cutting and removing the tape which extends outside the recess before molding resin over the ends of the sub-assembly.

References Cited in the file of this patent

UNITED STATES PATENTS

| | | |
|---|---|---|
| 1,837,962 | Hensgen | Dec. 22, 1931 |
| 2,479,400 | Pecoroni et al. | Aug. 16, 1949 |
| 2,590,821 | Kiser | Mar. 25, 1952 |
| 2,829,426 | Franklin | Apr. 8, 1958 |
| 2,862,992 | Franz | Dec. 2, 1958 |
| 2,888,652 | Niederman et al. | May 26, 1959 |